(12) United States Patent
Du Bois et al.

(10) Patent No.: US 10,518,418 B2
(45) Date of Patent: *Dec. 31, 2019

(54) WAFER SWAPPER

(71) Applicant: Applied Materials, Inc., Santa Clara, CA (US)

(72) Inventors: Dale R. Du Bois, Los Gatos, CA (US); Juan Carlos Rocha-Alvarez, San Carlos, CA (US); Karthik Janakiraman, San Jose, CA (US); Hari K. Ponnekanti, San Jose, CA (US); Sanjeev Baluja, Campbell, CA (US); Prajeeth Wilton, Chennai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 207 days.

This patent is subject to a terminal disclaimer.

(21) Appl. No.: 15/860,102

(22) Filed: Jan. 2, 2018

(65) Prior Publication Data

US 2018/0117771 A1 May 3, 2018

Related U.S. Application Data

(63) Continuation of application No. 14/972,366, filed on Dec. 17, 2015, now Pat. No. 9,889,567.

(60) Provisional application No. 62/152,300, filed on Apr. 24, 2015.

(51) Int. Cl.
*H01L 21/67* (2006.01)
*B25J 11/00* (2006.01)
*H01L 21/677* (2006.01)

(52) U.S. Cl.
CPC ..... *B25J 11/0095* (2013.01); *H01L 21/67196* (2013.01); *H01L 21/67742* (2013.01); *H01L 21/67748* (2013.01)

(58) Field of Classification Search
CPC .......... B25J 11/0095; H01L 21/67196; H01L 21/67742; H01L 21/67748
USPC ........................................................ 414/217
See application file for complete search history.

(56) References Cited

U.S. PATENT DOCUMENTS

| RE32,538 E | 11/1987 | Hawkswell |
| 2002/0029936 A1* | 3/2002 | McClintock ...... H01L 21/67742 187/267 |
| 2002/0190051 A1 | 12/2002 | Wang et al. |
| 2010/0178136 A1 | 7/2010 | Ago |
| 2012/0027542 A1 | 2/2012 | Isomura et al. |
| 2012/0320361 A1 | 12/2012 | Ishikawa et al. |
| 2014/0003890 A1 | 1/2014 | Goto |
| 2014/0064886 A1 | 3/2014 | Toshima |

FOREIGN PATENT DOCUMENTS

TW M529933 U 10/2016

* cited by examiner

*Primary Examiner* — Ronald P Jarrett
(74) *Attorney, Agent, or Firm* — Patterson + Sheridan LLP (57) ABSTRACT

The present disclosure generally relates to semiconductor process equipment used to transfer semiconductor substrates between process chambers. More specifically, embodiments described herein are related to systems and methods used to transfer, or swap, semiconductor substrates between process chambers using a transport device that employs at least two blades for the concurrent transfer of substrates between processing chambers.

19 Claims, 6 Drawing Sheets

WAFER SWAPPER

CROSS-REFERENCE TO RELATED APPLICATIONS

This application is a continuation application of U.S. patent application Ser. No. 14/972,366, filed Dec. 17, 2015, which claims benefit of U.S. Provisional Patent Application Ser. No. 62/152,300, filed Apr. 24, 2015, the entirety of which are incorporated herein by reference.

BACKGROUND

Field

Embodiments of the present disclosure generally relate to semiconductor processing equipment. More specifically, embodiments disclosed herein relate to a system and method for wafer transfer.

Description of the Related Art

Semiconductor devices are typically formed on semiconductor substrates using numerous process chambers, where each process chamber is used to complete one or more of the various processes (e.g., depositions) to form the semiconductor devices, such as a memory chip. Efficient substrate throughput in semiconductor processing is always a challenge. Substrate transfer systems are typically used to move the substrates between each of the process chambers. The process chambers as well as the substrate transfer system can be held at vacuum. Two common arrangements used for substrate transfer systems include a cluster arrangement and a linear arrangement.

A substrate transfer system using a cluster arrangement includes a central region surrounded by the different process chambers. The central region can be connected to a load lock chamber in order to maintain the vacuum environment within the substrate transfer chamber system when the substrates are supplied and removed from the substrate transfer system. The central region, or transfer chamber, also typically includes a robot that rotates about a central axis to move substrates to and from the load lock chamber as well as between the process chambers. These conventional robots are often limited to only transferring one or two substrates at a time and can cause the footprint of the central region to be large, due to the need for the robot to rotate and extend into the process chambers without the robot arm interfering with the walls of the central region chamber in which the robot resides. These types of conventional robots can also be a source of particles, which is undesirable.

A substrate transfer system using a linear arrangement typically includes a conveyor having a rectangular top surface with process chambers on one side or opposing sides of the conveyor. The conveyor can be connected to a load lock chamber in order to maintain the vacuum environment within the substrate transfer system when the substrates are supplied and removed from the substrate transfer system. One or more robots can be positioned near each of the process chambers to transfer the substrates between the conveyor and the process chambers. The conveyors used in these linear substrate transfer systems can be a source of particle generation, and involve regular maintenance activities to assure that the conveyor is performing correctly. Furthermore, the conveyor can only be moved in one direction at a time, which can limit the movement of the substrates on the conveyor reducing throughput.

As the foregoing illustrates, there is a need for an improved substrate transfer system for exchanging substrates between processing chambers that maintains a reduced footprint as well as increased throughput.

SUMMARY

The present disclosure generally relates to semiconductor process equipment used to transfer semiconductor substrates between process chambers. More specifically, embodiments described herein are related to systems and methods used to swap, or transfer, semiconductor substrates between process chambers using a transport device that employs at least two blades for the concurrent transfer of substrates between processing chambers.

In one embodiment, a system for processing a substrate is disclosed. The system for processing a substrate comprises at least two processing chambers each having a slit valve configured to receive a substrate and a transfer chamber system operatively connected with the at least two processing chambers. The transfer chamber system comprises a first chamber, a second chamber, a first slide assembly disposed within the first chamber, a second slide assembly disposed within the second chamber, and a plurality of stepper motors, wherein each stepper motor is operatively connected with at least one slide assembly. The transfer chamber system further comprises a first two-movement robot blade and a second two-movement robot blade each coupled to the first slide assembly, wherein the first two-movement robot blade has a rotational movement direction along a first plane and the second two-movement robot blade has a rotational movement direction along a second plane, and wherein the first plane and the second plane do not intersect. The transfer chamber system further comprises a third two-movement robot blade and a fourth two-movement robot blade each coupled to the second slide assembly, wherein the third two-movement robot blade has a rotational movement direction along a third plane and the fourth two-movement robot blade has a rotational movement direction along a fourth plane, and wherein the third plane and the fourth plane do not intersect.

In another embodiment, a system for transferring substrates is disclosed. The system for transferring substrates comprises a first processing chamber and a second processing chamber, a substrate transfer apparatus having a first side coupled to the first processing chamber and a second side opposite the first side, the second side coupled to the second processing chamber, wherein a first slit valve allows for access between the substrate transfer apparatus and the first processing chamber, and a second slit valve allows for access between the substrate transfer apparatus and the second processing chamber. The system for transferring substrates further comprises a first robot blade and a second robot blade disposed within the substrate transfer apparatus, wherein the first robot blade reaches a first position proximate to the first substrate support and a second position proximate to the second substrate support, and the second robot blade reaches the second position proximate to the second substrate support and the first position proximate to the first substrate support, and wherein the first slit valve and the second slit valve each has a dimension to accommodate the first robot blade and the second robot blade at the same time. The system for transferring substrates also comprises at least one servo motor, wherein the servo motor is operatively connected with a belt, wherein the belt is operatively connected with a screw, wherein the screw is configured to move a slide operatively connected with the first robot blade and second robot blade.

In yet another embodiment, a method for swapping a substrate between a first processing chamber and a second processing chamber is disclosed. The method comprises raising a first substrate in the first processing chamber from a first position on a first heater to a second position via a first plurality of lift pins, and raising a second substrate in the second processing chamber from a third position on a second heater to a fourth position via a second plurality of lift pins. The method further comprises securing the first substrate with a first robot blade at the second position, securing the second substrate with a second robot blade at the fourth position, operating the first robot blade to move the first substrate from the second position in the first processing chamber to the fourth position in the second processing chamber, and operating the second robot blade to move the second substrate from the fourth position in the second processing chamber to the second position in the first processing chamber, wherein the operating of the second robot blade occurs concurrently with the operating of the first robot blade, and wherein the second robot blade moves the second substrate below the first robot blade. The method also comprises removing the first substrate from the first robot blade inside the second processing chamber via the second plurality of lift pins and removing the second substrate from the second robot blade inside the first processing chamber via the first plurality of lift pins, retracting the first robot blade and the second robot blade into a swapping chamber, and lowering the first plurality of lift pins and the second plurality of lift pins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to semiconductor process equipment used to transfer semiconductor substrates between process chambers. More specifically, embodiments described herein are related to systems and methods used to transfer, or swap, semiconductor substrates between process chambers using a transport device that employs at least two blades for the concurrent transfer of substrates between processing chambers.

The term "wafer" as used herein includes, for example, the term "substrate." As such, a wafer, or substrate, is a thin slice of semiconductor material, such as a crystalline silicon, used in electronics for the fabrication of integrated circuits and in photovoltaics. It is contemplated that the terms "wafer" and "substrate" are not intended to be limiting and may include various examples beyond those described.

Traditionally, the transfer of substrates occurred between two processing chambers by removing the substrate from the first processing chamber with a first substrate handler. The first substrate handler traditionally transferred the substrate onto an intermediate via for resting the substrate until a second substrate handler picked up the substrate from the intermediate via. Subsequently, the second substrate handler would transfer the substrate to the second processing chamber.

Figure 1:
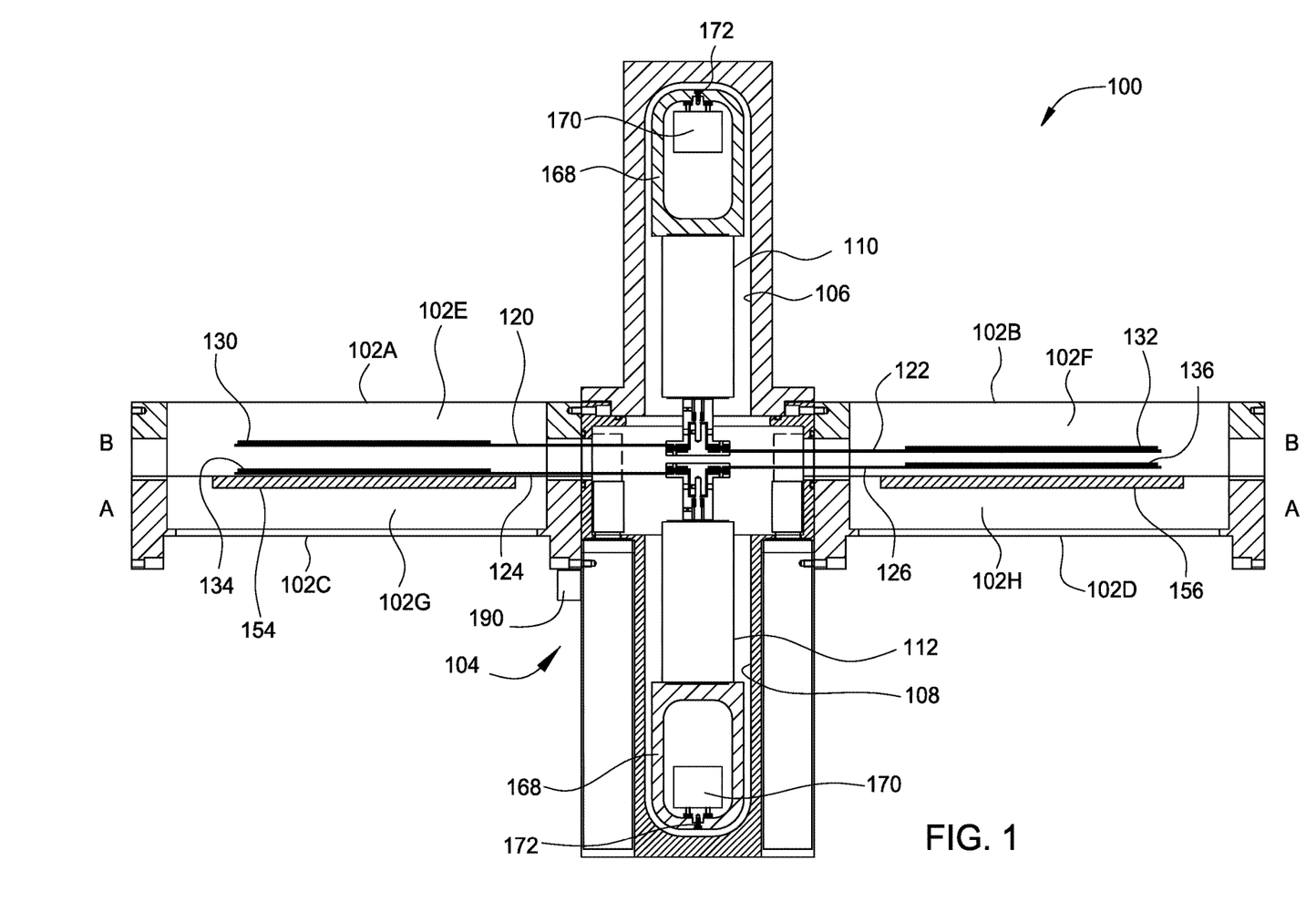
FIG. 1 is a cross-sectional front view of a system that may benefit from embodiments disclosed herein.

FIG. 1 is a front cross-sectional view of a substrate processing system 100 according to one embodiment of the disclosure. The substrate processing system 100 has a transfer chamber system 104 that eliminates the need for a via, or a place to rest the substrate so that the substrate handler can subsequently pick up the substrate for relocation, and utilizes robot blades in different horizontal planes such that multiple substrates can be swapped concurrently which offers a number of advantages. First, such a transfer chamber system 104 enables designs with a reduced footprint because, without a via, space needed on a clean room floor is reduced. Furthermore, the concurrent transfer of multiple substrates allows each blade to utilize real estate from each processing chamber thus reducing the sizing needs of the transfer chamber system 104. A reduced transfer chamber size further reduces the footprint of the transfer chamber system 104. Reducing the footprint of a transfer chamber system 104 can reduce capital costs, operating costs, and maintenance costs of the system. Furthermore, the use of a transfer chamber system 104 as described herein eliminates the need for a purge process in a single chamber between two processes because different processes can be accomplished by different chambers.

It should be noted that directional words such as "up," "down," "above," "below," "vertical," "horizontal," and the like are not absolute directions, but relative to an orientation of the chamber, for example, relative to a basis plane of the chamber, which may be a plane defined by a substrate support in the chamber.

The substrate processing system 100 may include at least two processing chambers—a first processing chamber 102A and a second processing chamber 102B—between which the transfer of substrates may occur. Examples of the processing chambers 102A, 102B may include a PRODUCER® chamber, a PRECISION® chamber, and/or an APACHE® chamber, all commercially available from APPLIED MATERIALS, Inc. of Santa Clara, Calif. Chambers from other manufacturers may also be used in the substrate processing system 100. In certain embodiments, the substrate processing system 100 may include a first processing chamber 102A, a second processing chamber 102B, a third processing chamber 102C, and a fourth processing chamber 102D (See, e.g., FIG. 2). Each processing chamber 102A, 102B, 102C, 102D may interface with a transfer chamber system 104. Furthermore each processing chamber 102A, 102B, 102C, 102D may be coupled with the transfer chamber system 104, such as with, for example, a bolting mechanism or other appropriate connection. To illustrate further, and by way of example only, the first processing chamber 102A may be coupled to the transfer chamber system 104. The second processing chamber 102B may be coupled to the transfer chamber system 104. Thus, the first processing chamber 102A is coupled with the second processing chamber 102B by mutual connection with the transfer chamber system 104.

The first processing chamber 102A and the second processing chamber 102B may be coupled to the transfer chamber system 104, such as with, for example a bolting mechanism or other appropriate connection. Substrates from the first processing chamber 102A may be transferred by the transfer chamber system 104 to the second processing chamber 102B, and vice versa, by the embodiments described herein. The third processing chamber 102C and the fourth processing chamber 102D may also be coupled to the transfer chamber system 104. Substrates from the third processing chamber 102C may be transferred by the transfer chamber system 104 to the fourth processing chamber 102D, and vice versa, by the embodiments disclosed herein. For simplicity, the transferring of substrates between the first processing chamber 102A and the second processing chamber 102B is described herein, and the description is not repeated with respect to the third processing chamber 102C and the fourth processing chamber 102D. The reader will understand that the description applies equally to the third and fourth processing chambers 102C, 102D, as to the first and second processing chambers 102A, 102B, and to any additional pairs of processing chambers that might be added to the substrate processing system 100.

Each processing chamber 102A, 102B may have at least one slit valve 116 (See, e.g., FIG. 6 for additional views of the slit valve 116) configured to permit the transfer of a substrate into and/or out of the processing chambers 102A, 102B. The substrate processing system 100 may further include a transfer chamber system 104 located between the processing chambers 102A, 102B for effecting the transfer of substrates, for example by swapping, between the first processing chamber 102A and the second processing chamber 102B. The transfer chamber system 104 may be operatively connected to the processing chambers 102A, 102B via the slit valves 116 such that the substrate processing system 100 remains under vacuum. As such, a substrate may be transferred from the first processing chamber 102A to the second processing chamber 102B, and/or from the second processing chamber 102B to the first processing chamber 102A, via the transfer chamber system 104 without air breaks and without the use of an intermediate via, as discussed above. The term "operatively connected" relates to the physical relationship between two objects and enables an operation between the two objects, however each object may be coupled to or coupled with one another.

Multiple processing chambers and multiple transfer chamber systems may be interconnected using transfer chamber systems such as the transfer chamber system 104, such that a chain of chambers for the continuous and sequential processing of substrates, all under vacuum, may be had without air breaks and with a reduced clean room footprint. As such, an active substrate handoff between two process chambers may facilitate modular inline sequential processing capabilities of any number of sequential deposition processes without any air breaks.

Figure 2:
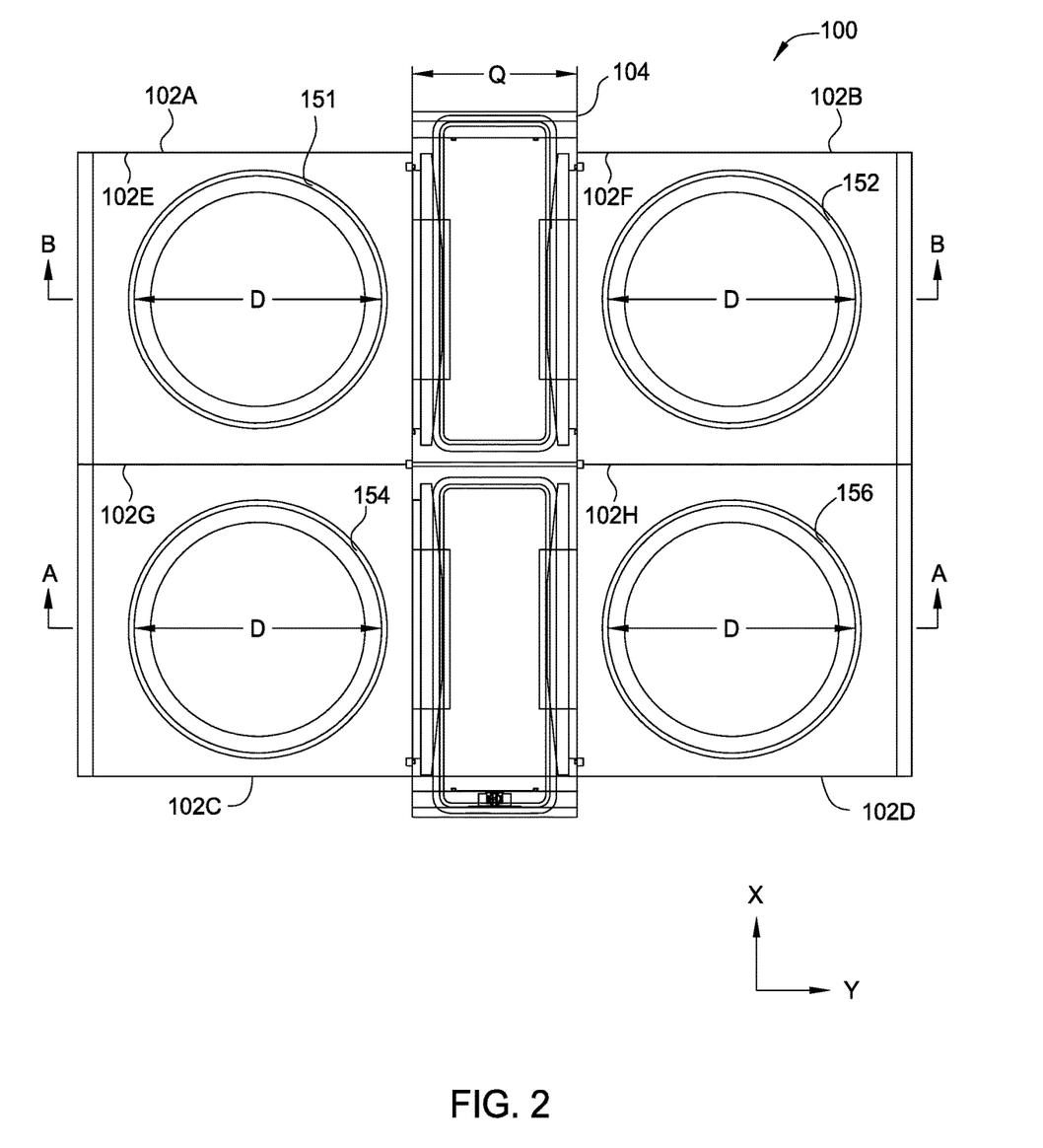
FIG. 2 is a cross-sectional top view of the system of FIG. 1, according to one embodiment.

The transfer chamber system 104, such as that shown in FIGS. 1 and 2, may include a first chamber 106, such as an upper chamber, and a second chamber 108, such as a lower chamber, within the transfer chamber system 104. During operation, the first chamber 106 and the second chamber 108 may be under vacuum. The first chamber 106 may be utilized to transfer the substrate between the first processing chamber 102A having a sidewall 102E and the second processing chamber 102B having a sidewall 102F, while the second chamber 108 may be utilized to transfer the substrate between the third processing chamber 102C having a sidewall 102G and the fourth processing chamber 102D having a sidewall 102H. As shown in FIG. 1, sidewalls 102G and 102H are visible by sectioning the third processing chamber 102C and the fourth processing chamber 102D at line A-A shown in FIG. 2. Also, as shown in FIG. 1, sidewalls 102E and 102F are visible by sectioning the first processing chamber 102A and the second processing chamber 102B at line B-B shown in FIG. 2.

A first slide assembly 110 may be disposed within the first chamber 106 and a second slide assembly 112 may be disposed within the second chamber 108. Each of the first and second slide assemblies 110, 112 may be a linear slide assembly and may further be encased within a bellows. The bellows may be a welded metal bellows utilized as a vacuum seal. The first slide assembly 110 and the second slide assembly 112 may each allow for motion in an X-direction.

The two-axis robot blades 120, 122 may be housed within the first chamber 106 of the transfer chamber system 104. As shown in FIG. 2, the transfer chamber system 104 may have a dimension Q less than a surface dimension, for example, a diameter D, of a substrate support of the processing chambers 102A, 102B. The dimension Q, for example a width of the transfer chamber system 104, may be less than the surface dimension, for example, diameter D, of the substrate support of the processing chamber 102A, 102B such that the transfer chamber 104 utilizes space within each processing chamber 102A, 102B to transfer substrates between the first processing chamber 102A and the second processing chamber 102B. Additionally, the dimension Q, for example a width of the transfer chamber 104, may be less than a width or length (not shown) of the substrate support of the processing chamber 102A, 102B in certain embodiments. With such surface dimension, the substrate would not fully fit within the confines of the transfer chamber 104 without the utilization of space within each processing chamber 102A, 102B during transfer. The surface dimension of the substrate may be a diameter of the substrate, a length of the substrate, a width of the substrate, or a diagonal of substrate.

In one embodiment, such as that shown in FIGS. 1 and 2, because the first substrate 130 and the second substrate 132 each utilize space from the first processing chamber 102A and the second processing chamber 102B during transfer, and the substrate processing system 100 lacks a via, if a first substrate 130 at a first location within the first processing chamber 102A is swapped with a second substrate 132 at a second location within the second processing chamber 102B, such swapping is concurrent and simultaneous within. In such cases, the first substrate 130 is received by the first two-movement robot blade 120 concurrently as the second substrate 132 is received by the second two-movement robot blade 122. Furthermore, the first two-movement robot blade 120 moves the first substrate 130 from the first location in the first processing chamber 102A to the second location in the second processing chamber 102B sequentially and simultaneously as the second two-movement robot blade 122 moves the second substrate 132 from the second location in the second processing chamber 102B to the first location in the first processing chamber 102A. As such, the first substrate 130 and the second substrate 132 may align momentarily at a substantially vertical axis of the transfer chamber system 104.

Referring back to the embodiment of FIG. 1, four two-movement robot blades 120, 122, 124, 126 are shown. As such, four substrates may be swapped at one time. For example, a first substrate 130 located in the first processing chamber 102A may be swapped with a second substrate 132 located in the second processing chamber 102B. The first substrate 130 may utilize a first two-movement robot blade 120 for the entire transfer between the first processing chamber 102A and the second processing chamber 102B. The second substrate 132 may utilize a second two-movement robot blade 122 for the entire transfer between the second processing chamber 102B and the first processing chamber 102A. A third substrate 134 located in the third processing chamber 102C may be swapped with a fourth substrate 136 located in the fourth processing chamber 102D. The third substrate 134 may utilize a third two-movement robot blade 124 for the entire transfer between the third processing chamber 102C and the fourth processing chamber 102D. The fourth substrate 136 may utilize a fourth two-movement robot blade 126 for the entire transfer between the fourth processing chamber 102D and the third processing chamber 102C.

The first slide assembly 110 and the second slide assembly 112 may each be coupled to at least two two-movement, such as a linear movement and a rotational movement, robot blades 120, 122. As such, the first chamber 106 may comprise a first two-movement robot blade 120 and a second two-movement robot blade 122, and the second chamber 108 may comprise a third two-movement robot blade 124 and a fourth two-movement robot blade 126. The robot blades 120, 122, 124, 126 may act to physically transfer the substrates between processing chambers 102A, 1026. The first two-movement robot blade 120 may have a rotational movement direction along a first plane. The second two-movement robot blade 122 may have a rotational movement direction along a second plane. In one embodiment, the rotational movement of either the first two-movement robot blade 120 and/or the second two-movement robot blade 122 may cause part of either the first two-movement robot blade 120 and/or the second two-movement robot blade 122 to move in a circular path. The circular path of the first two-movement robot blade 120 may define a first plane. The circular path of the second two-movement robot blade 122 may define a second plane. The first plane and the second plane may be parallel and, therefore, may not intersect. The first two-movement robot blade 120 may be disposed above the second two-movement robot blade such that upon concurrent movement the first two-movement robot blade 120 and the second two-movement robot blade 122 avoid collision. The stepper motors 150 may operate to move the robot blades 120, 122 in a theta direction of each respective plane.

Figure 3:
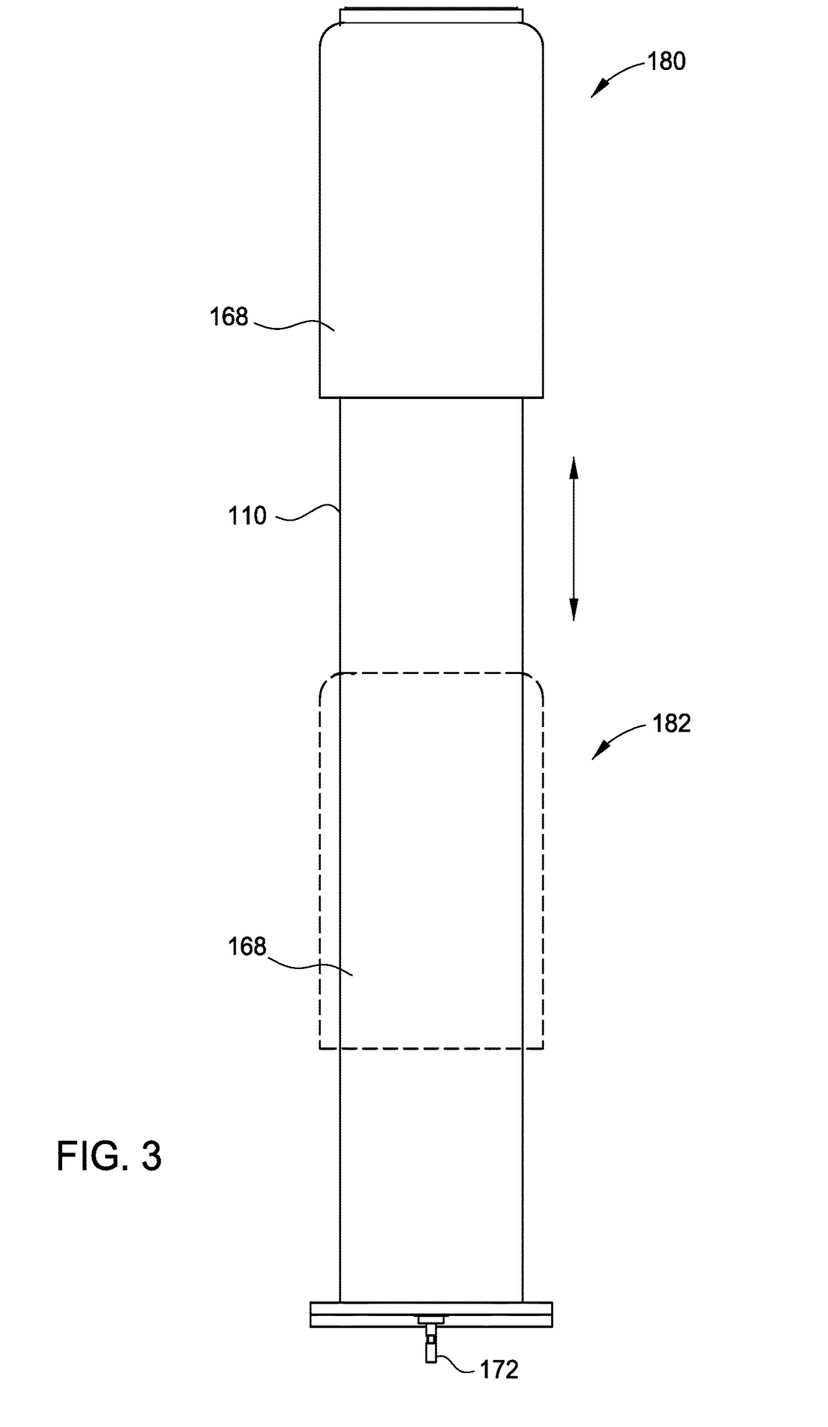
FIG. 3 is a top view of an X-axis drive assembly with servo motors and mounting brackets removed, according to one embodiment.

FIG. 3 illustrates a tap view of the slide assembly 110, 112 with the servo motor 140 and mounting hardware removed for clarity. The bellows linear slide assembly flange 168 may include a bellows which may move between a home position 180 and a load position 182. As such, the slide may be encased within the bellows which may be accordion-like. Upon movement of the slide assembly 110, 112 between positions along the X-axis, the bellows may expand or collapse in order to assist with the movement of the slide assembly 110, 112. An interior area of the bellows may remain at atmospheric pressure, while the exterior area of the bellows remains at vacuum.

Figure 4:
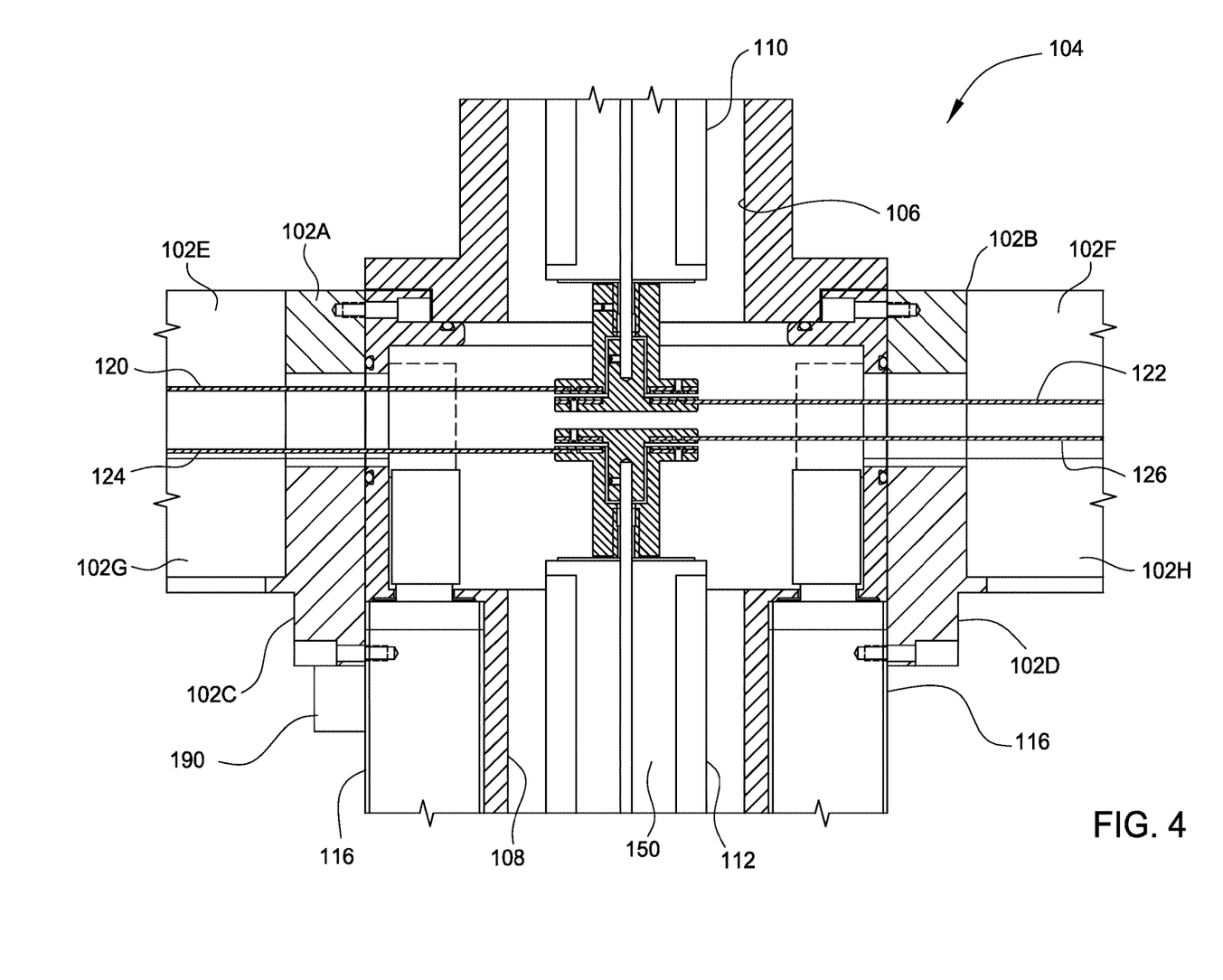
FIG. 4 is a cross-sectional front view of the blade mounting, according to one embodiment.

FIG. 4 illustrates an embodiment of the blade mounting within the transfer chamber 104. Specifically, FIG. 4 illustrates the locations of the slit valves 116 of the processing chambers 102A, 102B in relation to the two-movement robot blades 120, 122, 124, 126. Each slit valve 116 may have a dimension to accommodate the two-movement robot blades 120, 122, 124, 126.

The substrate processing system may transfer, or swap, two substrates in the first chamber 106 and may transfer, or swap, two substrates in the second chamber 108 in identical fashions as follows. In order to transfer the first substrate 130 from the first processing chamber 102A to the second processing chamber 102B, and the second substrate 132 from the second processing chamber 1026 to the first processing chamber 102A concurrently, some actions occurring to the first substrate 130 concurrently occur with respect to the second substrate 132. Lift pins (not shown) within the respective first and second processing chambers 102A, 102B raise the respective substrate 130, 132 off of a respective substrate support such as a heater 151, 152 (shown in FIG. 2) to a substrate handoff position. The substrate handoff position may be a position at which the lift pins (not shown) are extended and the substrate 130, 132 is no longer on the respective substrate support such as a heater 151, 152, 154, 156. The lift pins (not shown) may raise the substrate 130, 132 to the hand off position before the two-movement robot blades 120, 122, 124, 126 are moved from a home position, for example a position fully within the transfer chamber system 104, and while the slit valves 116 remain in a closed position. The lift pins (not shown) within the first processing chamber 102A may extend to a first length while in the hand off position, and the lift pins (not shown) within the second processing chamber 102B may extend to a second length while in the hand off position, wherein the first length and the second length are not equal. The first length may accommodate the two-movement robot blade 120, 122 disposed to receive the substrate 130, 132 from the first processing chamber 102A, and the second length may accommodate the two-movement robot blade 120, 122 disposed to receive the substrate 130, 132 from the second processing chamber 102B. The lift pins (not shown) may adjust based on the two-movement robot blade 120, 122 within the respective processing chamber 102A, 102B.

During a substrate transfer process, (e.g., a swapping process) or while no substrate is present within the respective processing chambers 102A, 102B, 102C, 102D the lift pins (not shown) of each respective processing chamber 102A, 102B, 102C, 102D may change height to accommodate a two-movement robot blade within the respective processing chamber 102A, 102B, 102C, 102D. For example, when the first two-movement robot blade 120 enters the first processing chamber 102A the lift pins (not shown) may raise the first substrate 130 to a first height in order for the first two-movement robot blade 120 to receive the first substrate 130. However, once the first substrate 130 has been received by the first two-movement robot blade 120 within the first processing chamber 102A, the lift pins (not shown) within the first processing chamber 102A may ascend or descend to a second height in order to receive the second substrate 132 from the second two-movement robot blade 122. By way of continued example, when the second two-movement robot blade 122 enters the second processing chamber 102B the lift pins (not shown) may raise the second substrate 132 to a first height in order for the second two-movement robot blade 122 to receive the second substrate 132. However, once the second substrate 132 has been received by the second two-movement robot blade 122 within the second processing chamber 102B, the lift pins (not shown) within the second processing chamber 102B may ascend or descend to a second height in order to receive the first substrate 130 from the first two-movement robot blade 120. As such, a controller 190 (See, FIGS. 1 and 4) may assist with the raising and/or lowering of the lift pins (not shown) in the respective processing chambers 102A, 102B, 102C, 102D.

Once each substrate 130, 132 reaches the hand off position (lift pins extended (not shown)), sensors (not shown) located within each processing chamber 102A, 102B may allow each slit valve 116 to open. Once each slit valve 116 has opened, the sensors may allow the servo motors 140 and the stepper motors 150 to operate as an over/under substrate handler.

The first chamber 106 and the second chamber 108 may each comprise at least two two-movement robot blades 120, 122, 124, 126. Within each of the first chamber 106 and the second chamber 108 the first two-movement robot blade 120, 124 may operate above the second two-movement robot blade 122, 126. Each two-movement robot blade 120, 122, 124, 126 may simultaneously move along the X-axis due to an activation of the servo motor 140 as well as move rotationally +/−90 degrees due to an activation of the stepper motor 150. The movement along the X-axis may be between about 4.0 inches and about 15.0 inches. In order to receive the substrate 130, 132, 134, 136, each two-movement robot blade 120, 122, 124, 126 may be stationed in the handoff position. A two-movement robot blade 120, 122, 124, 126 reaches the handoff position by moving in both the X-axis direction and the rotational theta direction simultaneously. Once a two-movement robot blade 120, 122, 124, 126 reaches the handoff position, the lift pins (not shown) may retract. Upon the retraction of the lift pins (not shown) the substrates 130, 132, 134, 136 are deposited onto the respective two-movement robot blade 120, 122, 124, 126 disposed in the handoff position. All substrates 130, 132, 134, 136 of the substrate processing system 100 may be concurrently deposited upon the respective two-movement robot blade 122, 122, 124, 126 at the same time.

After the substrates 130, 132, 134, 136 have been received onto the respective two-movement robot blade 120, 122, 124, 126, each two-movement robot blade 120, 122, 124, 126 is retracted along the X-axis via the servo motor 140 of the respective slide assembly 110, 112. Simultaneous with the movement along the X-axis each two-movement robot blade 120, 122, 124, 126 is rotationally moved to the home position via the stepper motor 150 of the respective slide assembly 110, 112. In order to transfer the first substrate 130 concurrently with the second substrate 132, the first two-movement robot blade 120 and the second two-movement robot blade 122 of the first chamber 106 move simultaneously. The first two-movement robot blade 120 may move above the second two-movement robot blade 122 so that the first two-movement robot blade 120 and the second two-movement robot blade 122 are not co-planar with respect to the rotational theta motion. In order to transfer the first substrate 130 the first two-movement robot blade 120 moves from the home position, for example, (0,0), along the X-axis to reach the hand off position proximate to the first heater 151 of the first processing chamber 102A at approximately, for example, (9,0) where (9,0) is a position along the X-axis nine units from the home position, in any suitable distance units. While moving along the X-axis to reach the hand off position proximate to the first heater 151 of the first processing chamber 102A as described above, the first two-movement robot blade 120 also moves from a theta of zero degrees to a theta of −90 degrees during the movement along the X-axis. After receiving the first substrate 130, the first two-movement robot blade 120 moves from the hand off position proximate to the first heater 151 of the first processing chamber 102A at approximately, for example, (9,0) to the home position (0,0). While moving along the X-axis as described above, the first two-movement robot blade 120 also moves from a theta of −90 degrees to a theta of zero degrees during the movement along the X-axis until the slide assembly reaches the home position (0,0).

In order to complete the transfer the first two-axis robot blade 120 then moves from the home position (0,0) along the X-axis to the hand off position proximate to the second heater 152 of the second processing chamber 102B at approximately, for example, (9,0). While moving along the X-axis as described above, the first two-movement robot blade 120 also moves from a theta of zero degrees to a theta of +90 degrees during the movement along the X-axis. Once the first two-movement robot blade 120 has reached the second processing chamber 102B the substrate will be released by the first two-movement robot blade 120 onto the respective heater 152 of the second processing chamber 102B. After releasing the first substrate 130, the first two-movement robot blade 120 may move from the hand off position proximate to the second heater 152 of the second processing chamber 102B at approximately, for example, (9,0) to the home position (0,0). While moving along the X-axis as described above, the first two-movement robot blade 120 may also move from a theta of +90 degrees during the movement along the X-axis until the slide assembly reaches the home position (0,0), at which time the first two-movement robot blade 120 will have a theta of zero degrees. As such, each two-movement robot blade 120, 122 is capable of a rotational movement of at least about 180 degrees.

Once each substrate has reached its new swapped position the lift pins (not shown) may extend in order to remove the substrate from the respective two-movement robot blade. Once the substrates have been received by the lift pins (not shown) and the two-movement robot blades have returned to the home position within the transfer chamber 104 a sensor within each chamber, for example a capacitive sensor disposed in each heater 151, 152, 154, 156 (shown in FIG. 2) to sense proximity of a substrate, may allow the respective slit valves 116 to close for substrate processing.

Figure 5:
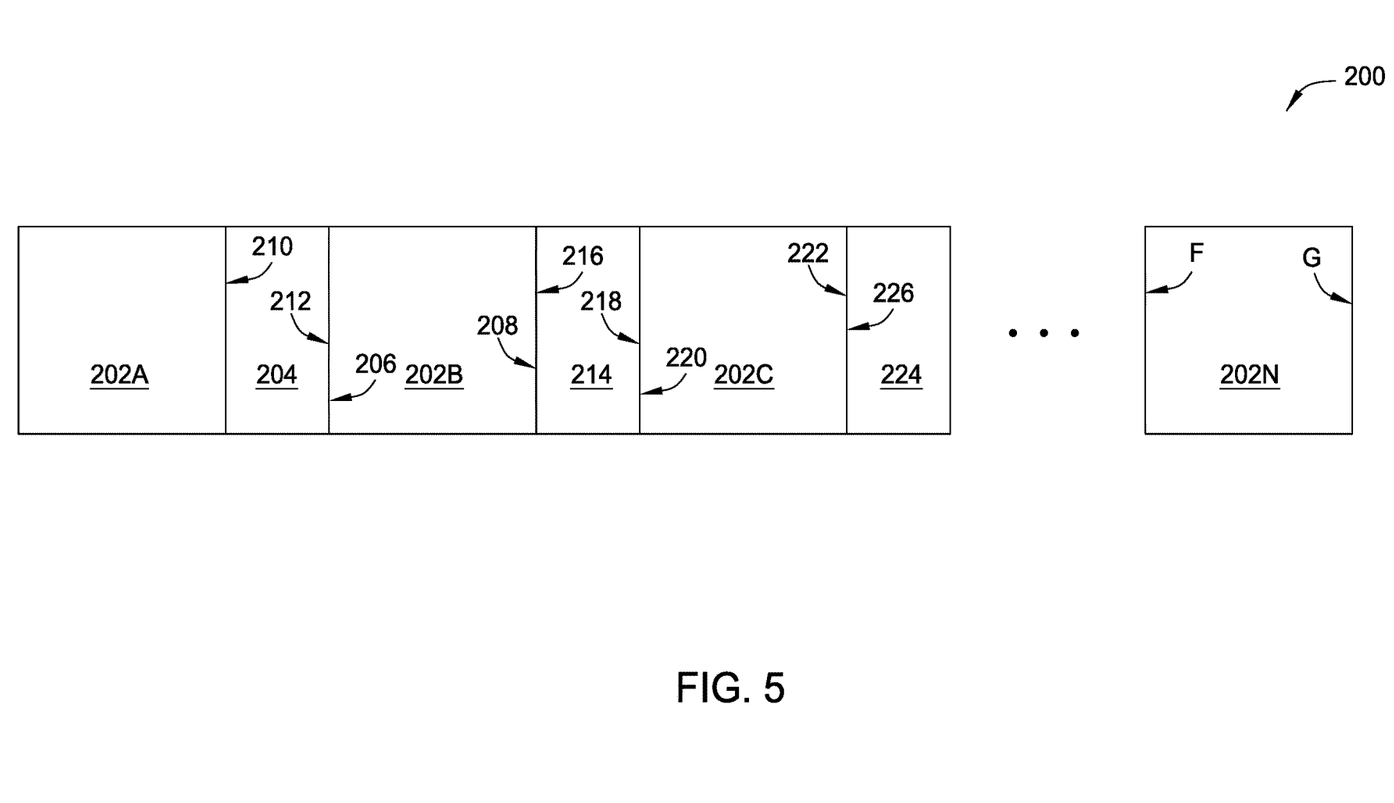
FIG. 5 is a front view of a wafer transfer system, according to one embodiment.

In some embodiments, and as shown in FIG. 5, a substrate processing system 200 further includes a first arrangement of process chambers 202A coupled with a first side 210 of a first transfer chamber 204. A second arrangement of process chambers 202B, having a first side 206 and a second side 208, may have a first side 206 of the second arrangement of process chambers 202B coupled with a second side 212 of the first transfer chamber 204. The second arrangement of process chambers 202B may have the second side 208 of the second arrangement of process chambers 202B coupled with a first side 216 of a second transfer chamber 214. A third arrangement of process chambers 202C, having a first side 220 and a second side 222, may have a first side 220 of the third arrangement of process chambers 202C coupled with a second side 218 of the second transfer chamber 214. The third arrangement of process chambers 202C may have the second side 222 of the second arrangement of process chambers 202C coupled with a first side 226 of a third transfer chamber 224. An $N^{th}$ arrangement of process chambers 202N, having a first side F and a second side G, may have the first side F of the $N^{th}$ arrangement of process chambers 202N coupled with a second side of an $N^{th}$ transfer chamber (not shown). N may represent any number of processing chambers and/or transfer chambers in a system for the processing of a substrate without exiting a vacuum environment, as substrates may be swapped quickly between processing chambers with minimal impact to the system 200 footprint. As such, a modular inline sequential processing ability is created that allows for any number of sequential deposition processes to occur without air breaks and without a long purge process between two processing chambers.

The substrate processing system 100 may also include a controller 190. The controller 190 is generally designed to facilitate the control and automation of the processing techniques described herein. The controller 190 may be coupled to or in operative communication with one or more of the servo motors 140, the stepper motors 150, the slide assemblies 110, 112, the transfer chamber system 104, a sensor (not shown), the lift pins (not shown), and the two-movement robot blades 120, 122, 124, 126. The transfer chamber system 104 may provide information to the controller 190 regarding substrate processing and substrate transferring. For example, the transfer chamber system 104 may provide information to the controller 190 to alert the controller 190 that substrate processing has been completed or that a substrate has been successfully transferred. By further example, the transfer chamber system 104 may provide information to the controller 190 to alert the controller 190 that a transfer of substrates is occurring. By providing such information, the controller 190 may provide information to the respective processing chambers 102A, 102B, 102C, 102D regarding which two-movement robot blade 120, 122, 124, 126 is entering or exiting each processing chamber 102A, 102B, 102C, 102D, in order to direct each processing chamber 102A, 102B, 102C, 102D to appropriately adjust the respective lift pin height.

The controller 190 may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position or location.

Figure 6:
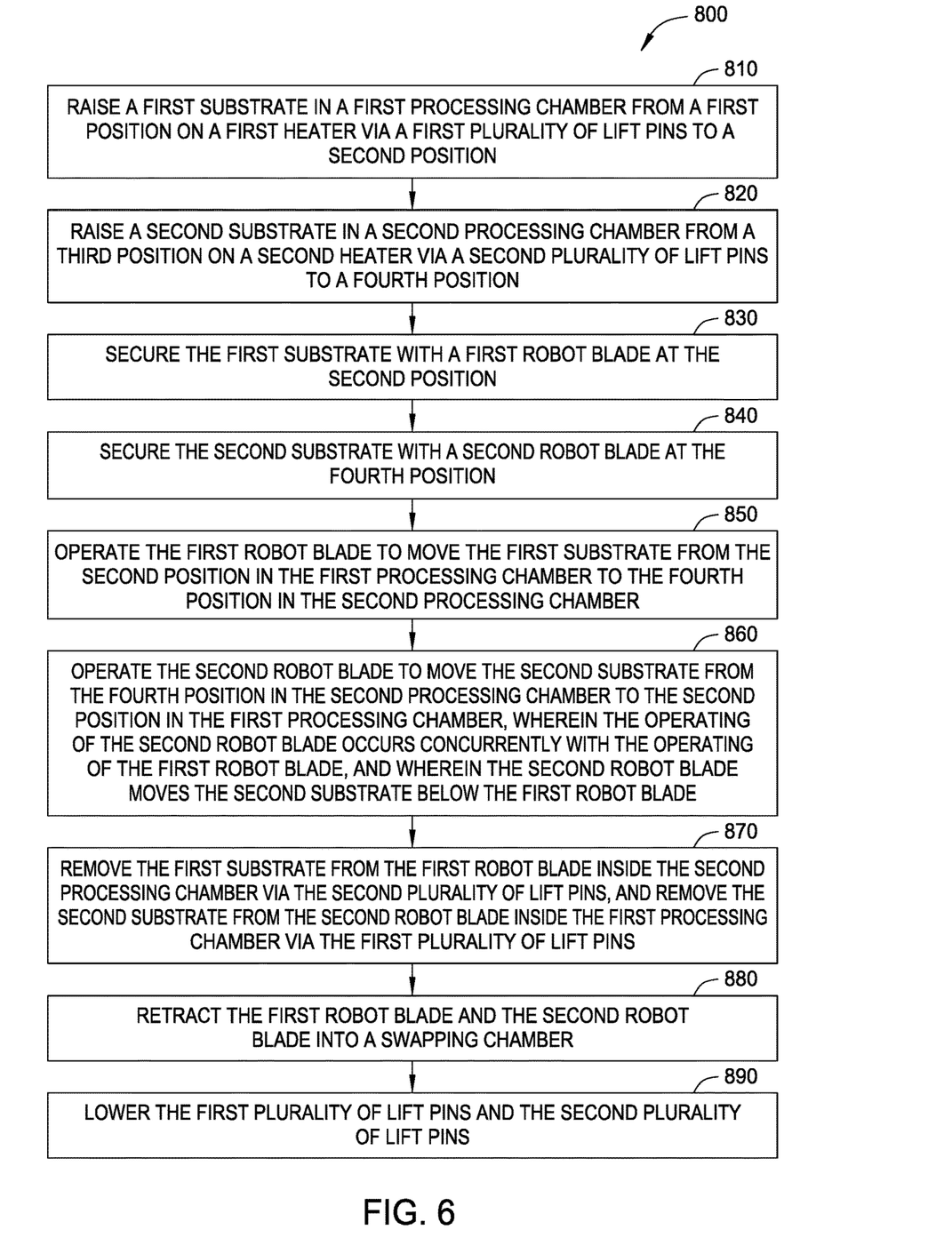
FIG. 6 schematically illustrates operations of a method for swapping substrates between a first processing chamber and a second processing chamber.

FIG. 6 schematically illustrates operations of a method 800 for swapping a substrate between a first processing chamber and a second processing chamber. At operation 810, a first substrate is raised in the first processing chamber from a first position on a first heater via a first plurality of lift pins (not shown) to a second position. At operation 820, a second substrate is raised in the second processing chamber from a third position on a second heater via a second plurality of lift pins (not shown) to a fourth position. The raising of the second substrate may occur concurrently with the raising of the first substrate.

At operation 830, the first substrate is secured with a first robot blade at the second position. At operation 840, the second substrate is secured with a second robot blade at the fourth position. The securing of the second substrate may occur concurrently with the securing of the first substrate.

At operation 850, the first robot blade is operated to move the first substrate from the second position in the first processing chamber to the fourth position in the second processing chamber. At operation 860, the second robot blade is operated to move the second substrate from the fourth position in the second processing chamber to the second position in the first processing chamber, wherein the operating of the second robot blade occurs concurrently with the operating of the first robot blade, and wherein the second robot blade moves the second substrate below the first robot blade.

At operation 870, the first substrate is removed from the first robot blade inside the second processing chamber via the second plurality of lift pins (not shown), and the second substrate is removed from the second robot blade inside the first processing chamber via the first plurality of lift pins (not shown). The removing of the first substrate and the second substrate may occur concurrently. At operation 880, the first robot blade and the second robot blade are retracted into a swapping chamber. The retracting may occur concurrently. At operation 890, the first plurality of lift pins (not shown) and the second plurality of lift pins (not shown) are lowered.

The substrate transfer system disclosed herein provides for the simultaneous transfer of at least two substrates quickly between at least two process chambers that are designed to perform different processes. The different processes may be performed sequentially and without and air break. The embodiment allows for minimal impact to the system footprint. As such, any number of processes can be performed on a substrate without a long purge process between processes which minimizes cross contamination between the processes, as the purge process is time consuming and often leads to unacceptable substrate throughput rates. Furthermore, the system disclosed allows for an active substrate handoff between at least two different process chambers which facilitates modular inline sequential processing capabilities for any number of sequential deposition processes without any air breaks. Additionally, the need for an intermediate via is eliminated, and clean room space is saved.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A system for processing a substrate, comprising:
   at least two processing chambers each having a slit valve and a substrate support configured to receive a substrate; and
   a transfer chamber operatively connecting the at least two processing chambers and having a maximum width less than a surface dimension of the substrate support, the transfer chamber comprising:
   a slide assembly disposed within the transfer chamber;
   a stepper motor operatively connected with the slide assembly; and
   two robot blades coupled to the slide assembly.

2. The system of claim 1, wherein each processing chamber contains one robot blade.

3. The system of claim 1, wherein one robot blade is disposed above the other robot blade.

4. The system of claim 1, wherein the stepper motor divides a full rotation of each robot blade into a number of equal steps.

5. The system of claim 4, wherein the full rotation is 90 degrees.

6. The system of claim 4, wherein the number of equal steps is 5.

7. The system of claim 1, further comprising a servo motor, wherein the servo motor controls linear motion of the slide assembly.

8. A system for processing a substrate, comprising:
a first processing chamber and a second processing chamber;
a substrate transfer chamber having a first side coupled to the first processing chamber and a second side opposite the first side, the second side coupled to the second processing chamber;
a linear slide operatively connected with the substrate transfer chamber;
a first robot blade and a second robot blade operatively connected with the slide and disposed within the substrate transfer chamber, wherein the first robot blade extends between a first position proximate to a first substrate support and a second position proximate to a second substrate support, and the second robot blade extends between the second position proximate to the second substrate support and the first position proximate to the first substrate support; and
a servo motor operatively connected to move the slide.

9. The system of claim 8, wherein the first substrate support is within the first processing chamber and the second substrate support is within the second processing chamber.

10. The system of claim 8, wherein a stepper motor is operatively connected to the slide and the first robot blade and the second robot blade.

11. The system of claim 10, wherein the stepper motor divides a full rotation of the robot blade into a number of equal steps.

12. The system of claim 11, wherein the full rotation is 90 degrees.

13. The system of claim 11, wherein the number of equal steps is 5.

14. The system of claim 8, wherein one robot blade of the first and second robot blades is disposed above the other robot blade of the first and second robot blades.

15. The system of claim 8, further comprising a controller configured to:
control positioning of the first robot blade and the second robot blade; and
control rotational movement of the first robot blade and the second robot blade.

16. The system of claim 8, further comprising a third processing chamber coupled to the first side of the substrate transfer chamber adjacent the first processing chamber and a fourth processing chamber coupled to the second side of the substrate transfer chamber adjacent the second processing chamber.

17. The system of claim 16, wherein a third substrate support is within the third processing chamber and a fourth substrate support is within the fourth processing chamber.

18. A system for processing a substrate, comprising:
a first processing chamber and a second processing chamber;
a substrate transfer chamber having a first side coupled to the first processing chamber and a second side opposite the first side, the second side coupled to the second processing chamber;
a slide operatively connected with the substrate transfer chamber;
a first robot blade and a second robot blade operatively connected with the slide and disposed within the substrate transfer chamber, wherein the first robot blade extends between a first position proximate to a first substrate support and a second position proximate to a second substrate support, and the second robot blade extends between the second position proximate to the second substrate support and the first position proximate to the first substrate support, wherein the substrate transfer chamber has a maximum width that is less than a surface dimension of the first substrate support and the second substrate support, and
a servo motor operatively connected to move the slide.

19. A method for swapping a substrate between a first processing chamber and a second processing chamber, comprising:
raising a first substrate in the first processing chamber from a first position on a first substrate support to a second position above the first substrate support;
raising a second substrate in the second processing chamber from a third position on a second substrate support to a fourth position above the second substrate support;
securing the first substrate with a first robot blade at the second position;
securing the second substrate with a second robot blade at the fourth position;
operating the first robot blade to move the first substrate from the second position in the first processing chamber to the fourth position in the second processing chamber;
operating the second robot blade to move the second substrate from the fourth position in the second processing chamber to the second position in the first processing chamber, wherein the operating of the second robot blade occurs concurrently with the operating of the first robot blade, and wherein the second robot blade moves the second substrate below the first robot blade;
removing the first substrate from the first robot blade inside the second processing chamber and removing the second substrate from the second robot blade inside the first processing chamber; and
retracting the first robot blade and the second robot blade into a transfer chamber, wherein the transfer chamber has a maximum width that is less than a surface dimension of the first substrate support and the second substrate support.

* * * * *